(12) United States Patent
Pommer

(10) Patent No.: US 6,570,250 B1
(45) Date of Patent: May 27, 2003

(54) POWER CONDITIONING SUBSTRATE STIFFENER

(75) Inventor: Richard J. Pommer, Trabuco Canyon, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/512,969

(22) Filed: Feb. 24, 2000

(51) Int. Cl.[7] .............................................. H01L 23/02
(52) U.S. Cl. ...................... 257/731; 257/731; 257/734; 257/704; 257/706
(58) Field of Search ................... 257/774, 678, 257/685, 693, 697, 698, 704, 706, 731, 734, 788

(56) References Cited

U.S. PATENT DOCUMENTS

| | | | | | |
|---|---|---|---|---|---|
| 4,221,047 A | * | 9/1980 | Narken | ........................ | 29/840 |
| 4,814,857 A | * | 3/1989 | Werbizky | ..................... | 357/74 |
| 5,625,222 A | * | 4/1997 | Yoneda | ....................... | 257/687 |
| 5,866,943 A | * | 2/1999 | Mertol | ........................ | 257/712 |
| 5,877,043 A | * | 3/1999 | Alcoe | .......................... | 438/123 |
| 5,895,967 A | * | 4/1999 | Stearns | ....................... | 257/691 |
| 5,973,389 A | * | 10/1999 | Culnane | ..................... | 257/678 |
| 6,084,777 A | * | 7/2000 | Kalidas | ...................... | 257/707 |
| 6,111,313 A | * | 8/2000 | Kutlu | ......................... | 257/697 |
| 6,140,707 A | * | 10/2000 | Plepys | ........................ | 257/778 |
| 6,208,022 B1 | * | 3/2001 | Tamura | ...................... | 257/692 |

FOREIGN PATENT DOCUMENTS

JP      404343465 A    *   11/1992

* cited by examiner

Primary Examiner—Olik Chaudhuri
Assistant Examiner—Nathan W. Ha
(74) Attorney, Agent, or Firm—Rutan & Tucker, LLP; Robert D. Fish

(57) ABSTRACT

Utilization of the "dead space" previously occupied by a metal stiffener in an integrated circuit package as a location for power conditioning and converting mechanisms such as de-coupling capacitors and planar transformers.

10 Claims, 4 Drawing Sheets

POWER CONDITIONING SUBSTRATE STIFFENER

FIELD OF THE INVENTION

The field of the invention is integrated circuit packaging.

BACKGROUND OF THE INVENTION

As the amount of power required by ICs increases, there is increasing difficulty in passing sufficient power through interconnects to the ICs. To make the issue worse, as the IC power has risen, the voltages have dropped from 5 V to 3.3 V, then to 1.2 V, and now approach 1V. This increase in power and decrease in voltage has caused the current required to increase rapidly. At the same time the number of I/O's and the switching rates are increasing while the I/O pitch on the chip is decreasing. All of this causes high dI/dt power noise which make clean power distribution difficult. Although the use of decoupling capacitors can help reduce such noise, building capacitors into a substrate filled with high density visa tends to be difficult and costly.

SUMMARY OF THE INVENTION

The present invention is directed to utilizing the "dead space" previously occupied by a metal stiffener in an integrated circuit package as a location for power conditioning and converting mechanisms such as de-coupling capacitors and planar transformers.

Various objects, features, aspects and advantages of the present invention will become more apparent from the following detailed description of preferred embodiments of the invention, along with the accompanying drawings in which like numerals represent like components.

DETAILED DESCRIPTION

An IC package typically comprises an interconnect to which an IC is connected, and a copper stiffening frame which either surrounds the IC or covers one side of the package. In place of the typical solid frame, a power conditioning frame (PCF) comprising power conditioning and possibly converting mechanisms can be used. Power provided to the interconnect would pass through the PCF, back into the interconnect, and then into the IC.

The standard frames take up a relatively large amount of space so power conditioning frames sized similarly can contain sizable decoupling capacitors. Moreover, by moving de-coupling capacitors and similar devices off of the interconnect, the interconnect can be more fully tested without damaging such devices. After separate testing, the power conditioning frame and the interconnect can be coupled together. It is also contemplated to bring power into the interconnect at a higher voltage and use a PCF to step it down to power the I/O and logic portions of the IC. The ability to step down the voltage in the PCF greatly simplifies power distribution as it reduces the number of visa needed to transfer power through the interconnect. Moreover, moving any power conditioning off of the interconnect and into the PCF will likely shorten signal paths with a resulting decrease in inductance.

The use of a PCF to take advantage of dead space can also be accomplished where an IC is mounted directly to a printed circuit board (PCB) or card (PCC). In such embodiments, the interconnect comprises the PCB or PCC with the PCF having the same relationship to the IC and PCB/PCC as it does to an IC and interconnect combination. For the sake of simplicity, the term interconnect as used herein also includes PCBS and PCC's.

Figure 1:
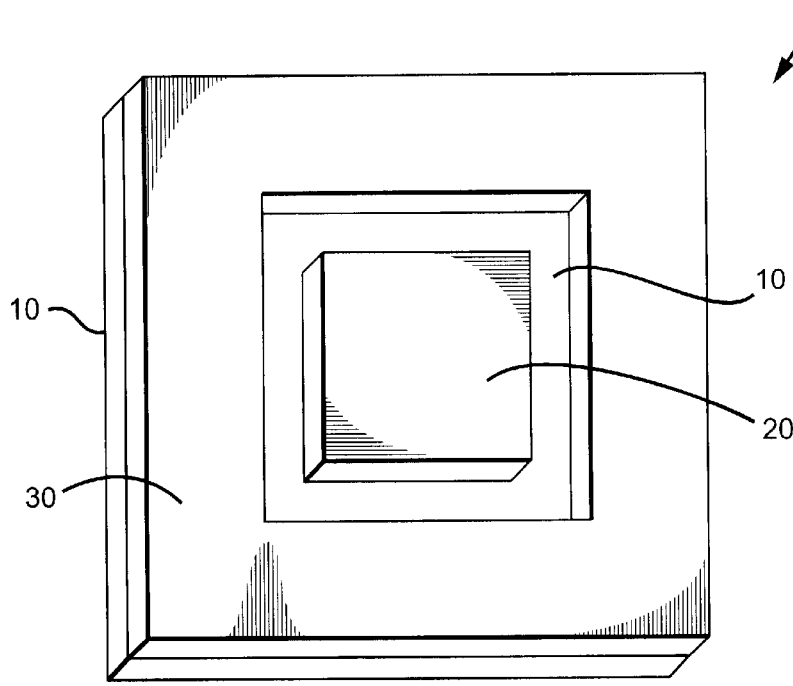
FIG. 1 is a top perspective view of a first combination embodying the invention.
Figure 2:
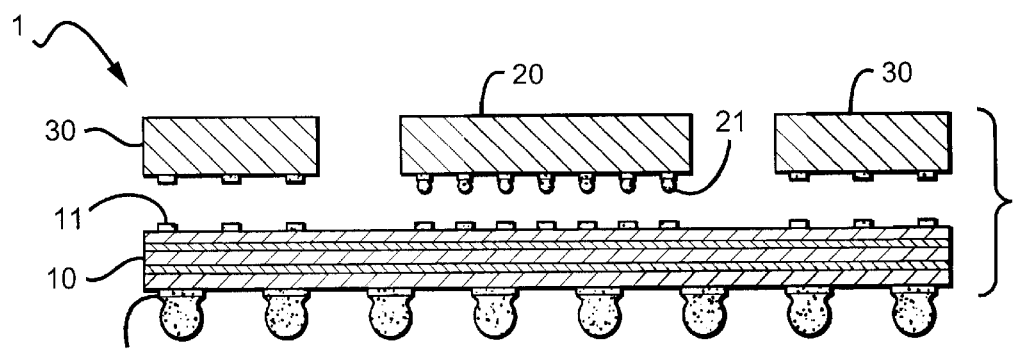
FIG. 2 is an exploded cross-sectional view of the combination of FIG. 1.
Figure 8:
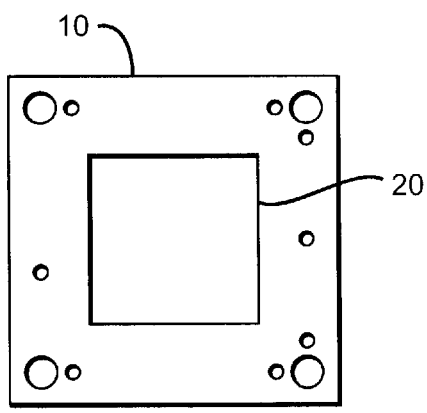
FIG. 8 is a top view of the printed circuit card and IC of FIG. 7.
Figure 9:
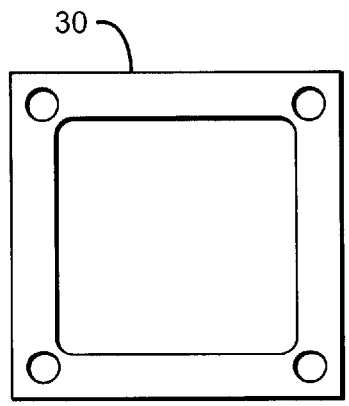
FIG. 9 is a top view of the PCF of FIG. 7.
Figure 11:
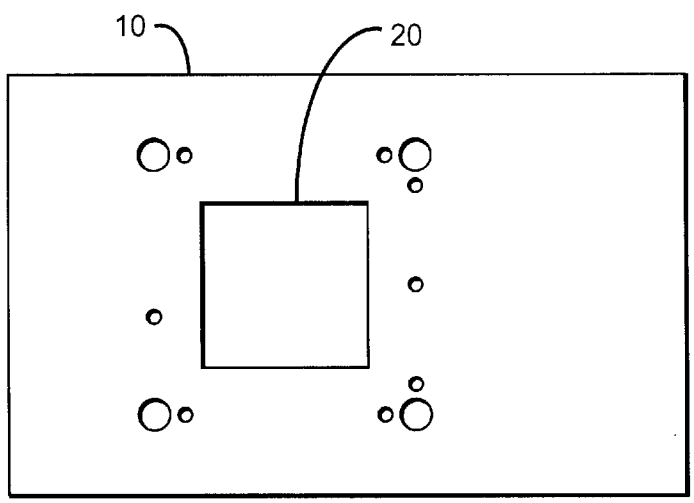
FIG. 11 is a top view of the printed circuit board and IC of FIG. 10.
Figure 12:
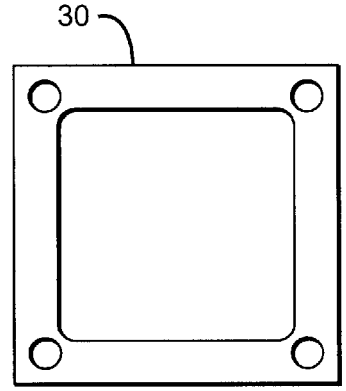
FIG. 12 is a top view of the PCF of FIG. 10.

Referring first to FIGS. 1 and 2, an IC package combination comprises an interconnect 10, an IC/die 20, and a PCF 30. When viewed from the top, as shown in FIGS. 8 and 11, the outer perimeters of interconnect 10 and IC 20 form substantially rectangular footprints with the footprint of IC 20 being smaller than and falling within the footprint of interconnect 10. PCF 30 is sized and dimensioned to fit within the dead space which falls outside the footprint of IC 20, but inside the footprint of interconnect 10. When viewed from the side it can be seen that both IC 20 and PCF 30 are preferably coupled to the same surface of interconnect 10.

Figure 4:
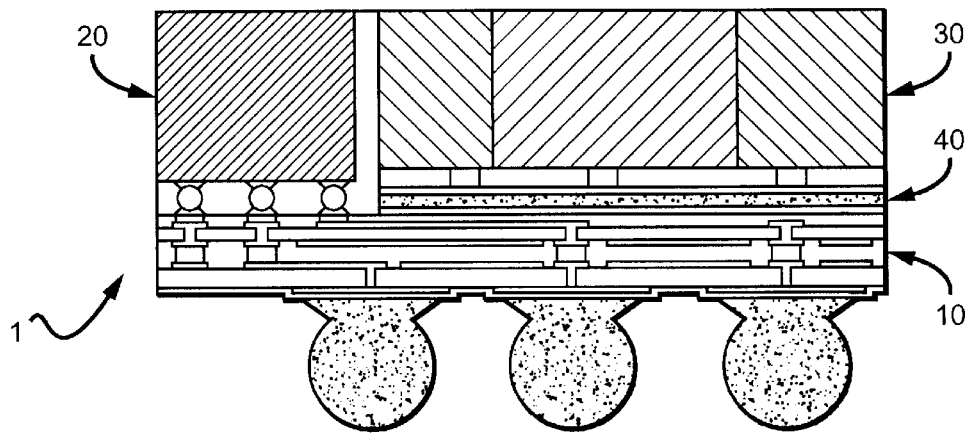
FIG. 4 is side cutaway view of a first FLIP-CHIP MLBGA combination embodying the invention.
Figure 5:
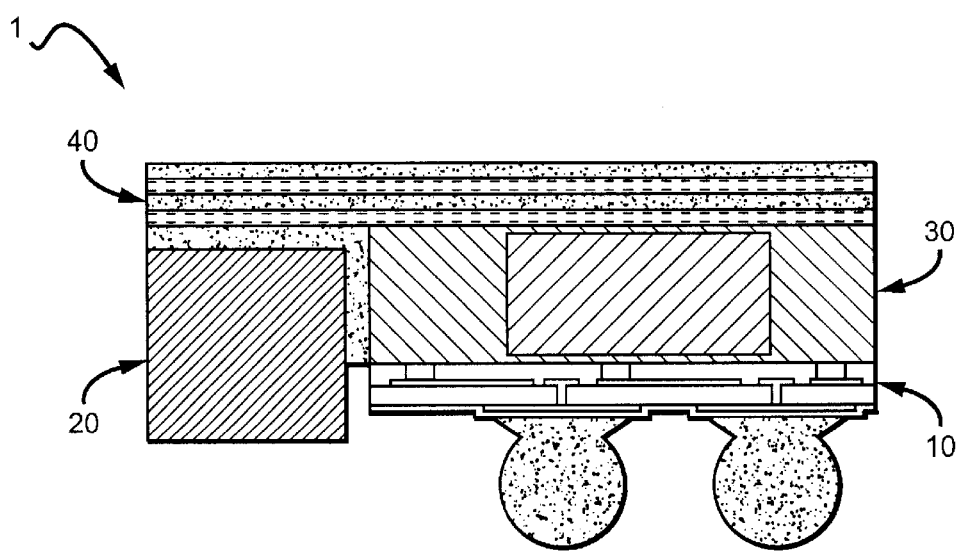
FIG. 5 is side cutaway view of a WIRE BONDED TBGA combination embodying the invention.
Figure 6:
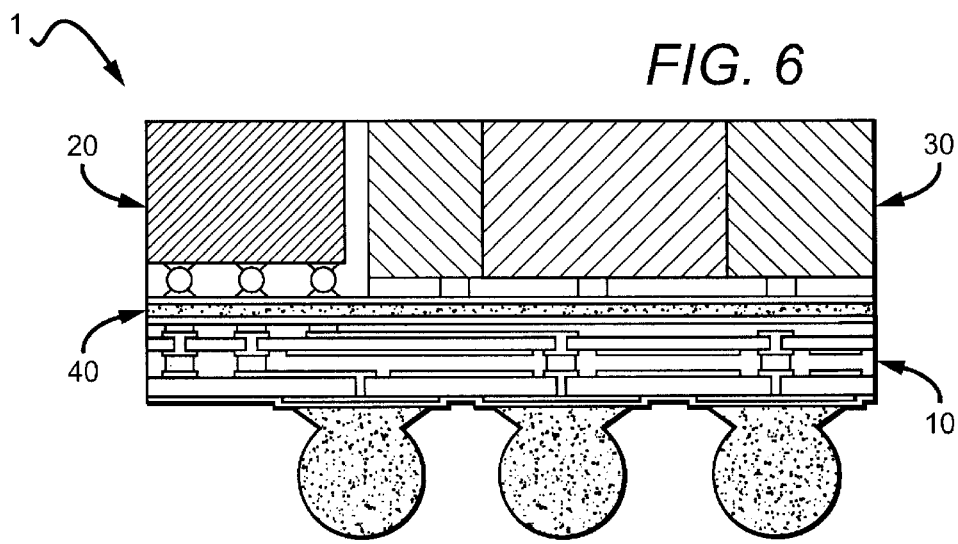
FIG. 6 is side cutaway view of a second FLIP-CHIP MLBGA combination embodying the invention.
Figure 7:
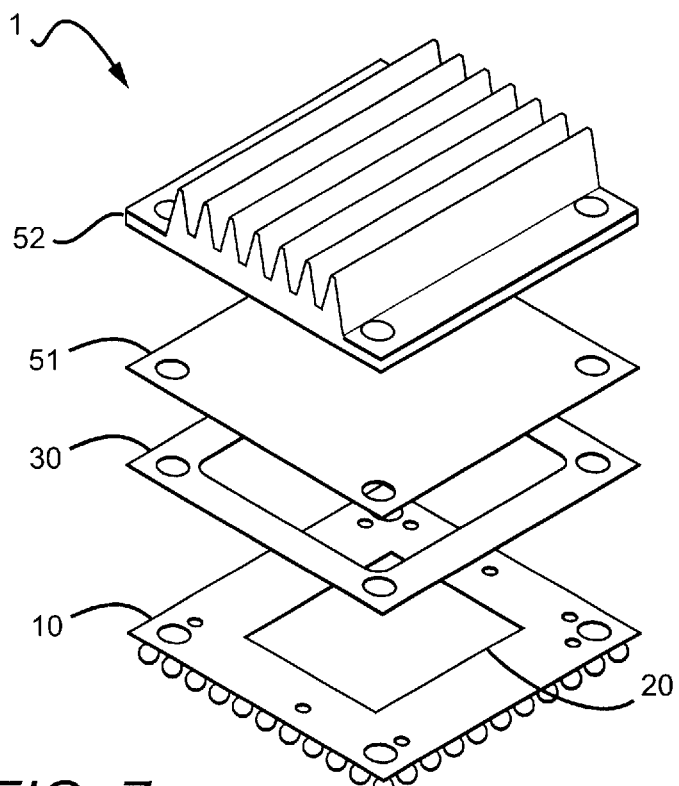
FIG. 7 is an exploded perspective view of a sixth combination embodying the invention.
Figure 10:
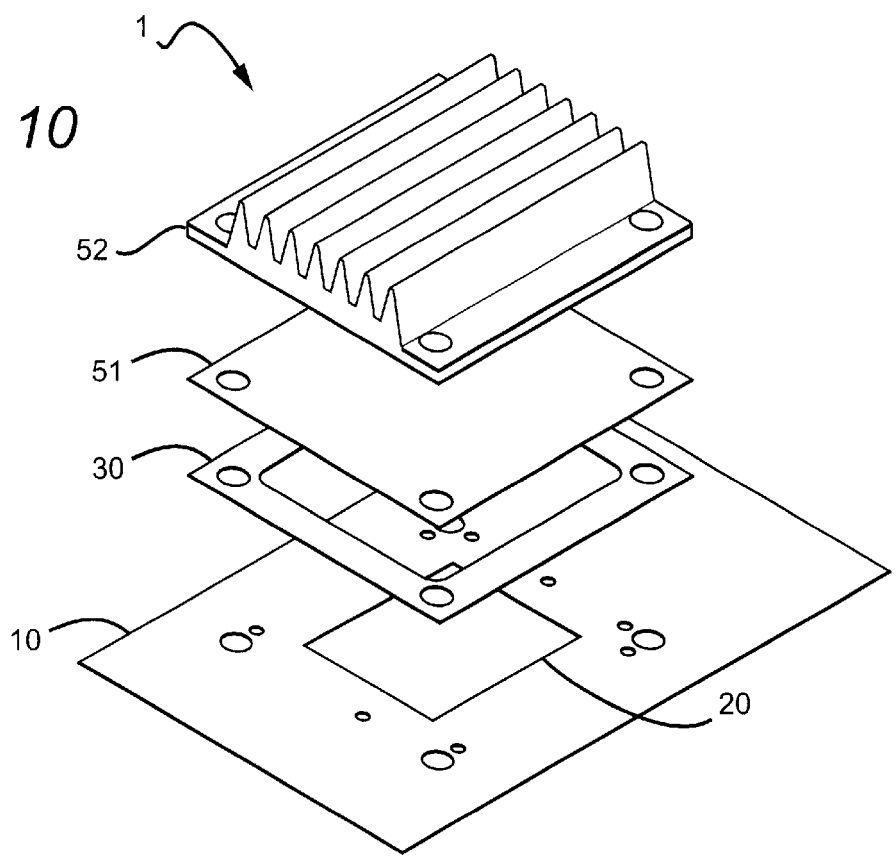
FIG. 10 is an exploded perspective view of a seventh combination embodying the invention.

Referring to FIG. 5, the IC package combination may be in a wire bonded TBGA form or, referring to FIGS. 4 and 6, in a flip-chip MLBGA form, or any other form which has sufficient dead space within which the PCF can be included. As shown in FIGS. 4–6 a power/ground decoupling layer 40 may also be part of the interconnect (FIGS. 5 and 6) or as part of the PCF (FIG. 4). Referring to FIGS. 7 and 10, the combination may also include a thermal transfer layer/copper plate 51 and/or a heat sink 52.

Figure 3:
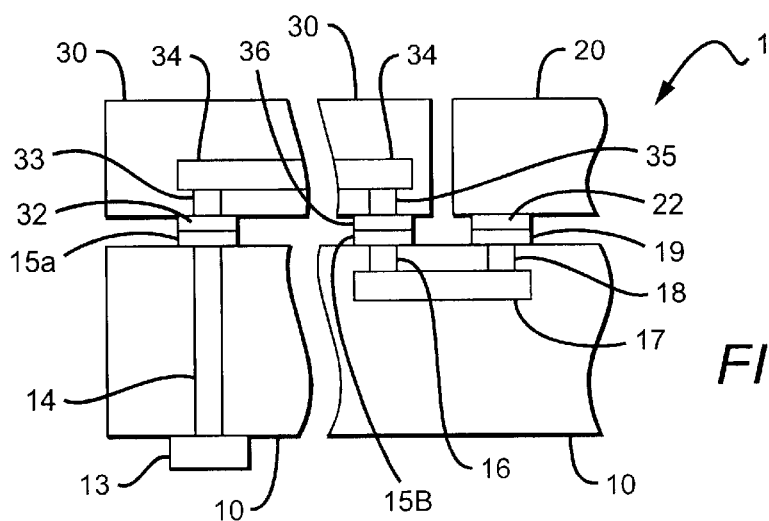
FIG. 3 is a detailed view of second combination embodying the invention.

Interconnect 10 can comprise any combination of materials but will typically comprise a first conductive pattern 11 and a second conductive pattern 12. The patterns 11 and 12 are typically electrically connected so as to allow the pattern 21 of IC 20 to be electrically connected to a printed wiring board (PCB) through interconnect 10. Referring to FIG. 3, interconnect 10 may comprise a power input pad 13, a via 14, pads 15a and 15b, vias 16 and 18, component 17, and pad 19. Pad 13, via 14, and pad 15A provide a path for power to pass through interconnect 10 to pad 32 of PCF 30. The power path then continues through PCF 30, back into interconnect 10 via pad 15B and through interconnect 10 by way of pad 15B, via 16, component 17, via 18, and pad 19 into power input pad 22 of IC 20. It can thus be seen that, in at least some embodiments, interconnect 10 will comprise a broken conductive path between a power input pad of the interconnect and a power input pad of the IC which is closed/bridged by PCF 30. Although other embodiments of interconnect 10 may comprise structures which vary widely from that shown in FIG. 3, it is contemplated that all preferred embodiments will comprise at least one power path which must be closed/bridged by PCF 30 before power provided to interconnect 10 can flow into IC 20. As previously discussed, interconnect 10 may, among others, be a PCB (FIG. 10) or PCC (FIG. 7) and/or may be used as the PCB of a multi-chip module (MCM).

As used herein, a power pad is a pad used to transfer power into or out of the IC, interconnect, or PCF. A conditioning pad is simply a pad which is part of the interconnect but is used to electrically connect the PCF to the interconnect. An interconnect power input pad is simply a pad used to transfer power into the interconnect so that it subsequently can be transferred through the PCF and then into the IC. A PCF is essentially a power or signal conditioning circuit sized and dimensioned to fit within the open space which results from the differences in sizes between the IC and the interconnect, and which can be assembled and tested separately from both the interconnect and the IC.

IC 20 can comprise any combination of materials but typically will comprise a conductive pattern 21 sized and dimensioned so as to make the use of interconnect 10 advantageous.

PCF 30 is preferred to comprise a conductive pattern 31 and at least one bridging component 34. Conductive pattern 31 is preferred to comprise at least one power input pad 32 and at least one power output pad 36 with visa 33 and 35 and component 34 providing a conductive path between pad 32 and pad 36.

Component 34 may be any type of component and thus might be, among others, a simply conductor, a resistor, a capacitor, an inductor, or a planar transformers. Instead of a single device, component 34 may comprise a network of homogeneous or diverse devices.

PCF 30 is preferred to be sized and dimensioned to fit within the dead space which results from the difference in sizes between an IC and its interconnect (see FIGS. 7–12). Although some embodiments may be frame shaped and comprise an inner hollow in which the IC fits so as to take advantage of all of the available dead space, other embodiments may utilize only a portion of the space and thus comprise a "thin" frame or to simply have a rectangular or other non-frame shape. In less preferred embodiments the PCF may be taller than the IC and/or may extend beyond the footprint of the interconnect.

It is contemplated that PCF 30 might also incorporate a thermal electric cooler or fan, may have other uses than power conditioning, and/or may be a passive, semi-active, or active device.

In some embodiments it may be advantageous to utilize ICs having power provided on the outside pads nearest there perimeters and logic inputs on the inside pads. Thus reversing the typical arrangement which utilizes inside pads as power inputs and outside pads as logic/signal inputs.

A combination utilizing a PCF as described may be assembled by, providing a known good IC; providing a known good interconnect; providing a known good PCF; coupling the IC to the interconnect; and coupling the PCF to the interconnect.

PCF 30 may condition one or more signals of provided by interconnect 10 in any number of ways including, but not necessarily limited to stepping voltages up or down, and filtering to provide spike protection and/or eliminate noise.

Thus, specific embodiments and applications of combinations utilizing power conditioning frames have been disclosed. It should be apparent, however, to those skilled in the art that many more modifications besides those already described are possible without departing from the inventive concepts herein. As an example, some embodiments may couple the PCF directly to the IC so that power or other signals provided to the interconnect pass through the PCF and then to the IC without reentering the interconnect. As an alternative example, the devices and methods disclosed herein might be applied to MOMS and PCBS as well as IC packages. Yet another alternative may condition non-power signals such that the PCF acts as a signal conditioning frame rather than a power conditioning frame. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A combination comprising:
   an integrated circuit (IC) comprising a power input pad;
   a power conditioning frame (PCF) that is not part of the IC; and
   an interconnect that is not part of the IC or PCF having an IC mounting surface comprising an IC power output pad, a first conditioning pad and a second conditioning pad; wherein
   the IC and PCF are each physically mounted on the IC mounting surface of the interconnect;
   the first conditioning pad is electrically coupled to the IC power output pad;
   the second conditioning pad is electrically coupled to an interconnect power input pad;
   the first and second conditioning pads are electrically connected to each other through the power conditioning frame; and
   the IC power input pad is electrically coupled to the interconnect IC power output pad.

2. The combination of claim 1 wherein the PCF comprises an electrical component which is part of a power path from the first conditioning pad to the second conditioning pad through the PCF, the power path electrically connecting the first and second conditioning pads.

3. The combination of claim 2 wherein the component is an active device.

4. The combination of claim 2 wherein the component is one of a capacitor, a resistor, an inductor or a network of capacitors resistors or inductors.

5. The combination of claim 2 wherein the component is a planar transformer.

6. The combination of claim 1 wherein the PCF comprises an inner hollow and the IC is positioned within the hollow.

7. The combination of claim 1 wherein the PCF comprises a conductive pattern having a power input pad coupled to a first via and a power output pad coupled to a second via, the PCF also comprising at least one bridging component wherein the first via, bridging component, and second via provide a conductive path between the a power input pad and power output pad.

8. A combination comprising:
   an integrated circuit (IC) comprising a power input pad;
   a power conditioning frame (PCF) that is not part of the IC, the PCF comprising a conductive pattern having a power input pad coupled to a first via and a power output pad coupled to a second via, the PCF also comprising at least one bridging component wherein the first via, bridging component, and second via form a conductive path; and an interconnect that is not part of the IC or PCF, the interconnect having four separate pads which include a first conditioning pad, a second conditioning pad, an IC power output pad, and an interconnect power input pad wherein the first conditioning pad is electrically coupled to the IC power output pad, the second conditioning pad is electrically coupled to the interconnect power input pad, and the interconnect power input pad and the IC power output pad are located on opposing surfaces of the interconnect while the IC power output pad and the first and second conditioning pads are located on a common surface of the interconnect; wherein the IC and PCF are each physically mounted on the IC mounting surface of the interconnect;

the first and second conditioning pads are electrically coupled to the PCF and are electrically coupled to each other by the conductive path formed by the fist via, bridging component, and second via of the PCF; and the IC power input pad is electrically coupled to the interconnect IC power output pad.

9. The combination of claim 8 wherein the bridging component is a planar transformer.

10. A combination of an interconnect, integrated circuit (IC) physically and electrically coupled to the interconnect, and a power conditioning (PCF) frame physically and electrically coupled to the interconnect wherein the PCF comprises a power or signal conditioning circuit and is sized and dimensioned to fit around the IC on the interconnect, and which can be assembled and tested separately from both the interconnect and the IC.

* * * * *